(12) United States Patent
Yang et al.

(10) Patent No.: US 6,632,742 B2
(45) Date of Patent: Oct. 14, 2003

(54) METHOD FOR AVOIDING DEFECTS PRODUCED IN THE CMP PROCESS

(75) Inventors: Ming-Cheng Yang, Taipei (TW); Jiun-Fang Wang, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 3 days.

(21) Appl. No.: 09/836,219

(22) Filed: Apr. 18, 2001

(65) Prior Publication Data

US 2002/0155716 A1 Oct. 24, 2002

(51) Int. Cl.$^7$ .................. H01L 21/302; H01L 21/461
(52) U.S. Cl. ........................... 438/690; 438/637
(58) Field of Search ................. 438/637, 638, 438/640, 690, 713, 735, 737, 700, 734, 738

(56) References Cited

U.S. PATENT DOCUMENTS 5,621,241 A * 4/1997 Jain
5,683,922 A * 11/1997 Jeng et al.
6,025,277 A * 2/2000 Chen et al.
6,197,661 B1 * 3/2001 Mogami et al.
6,355,515 B1 * 3/2002 Moon et al.

* cited by examiner

Primary Examiner—Phuc T. Dang
(74) Attorney, Agent, or Firm—Birch, Stewart, Kolasch & Birch, LLP

(57) ABSTRACT

A method for avoiding defects produced in The CMP process has the following steps: sequentially depositing a first dielectric layer and a second dielectric layer on a semiconductor substrate, wherein the wet-etching rate of the first dielectric layer is greater than the wet-etching rate of the second dielectric layer; forming a plurality of first holes on a plurality of the predetermined contact window areas respectively; wet etching the first dielectric layer in each of the first holes to form a plurality of second holes on the plurality of the predetermined contact window areas respectively; forming a conductive layer to fill each of the second holes; and performing the CMP process to level off the conductive layer and the second dielectric layer.

6 Claims, 6 Drawing Sheets

METHOD FOR AVOIDING DEFECTS PRODUCED IN THE CMP PROCESS

BACKGROUND OF THE INVENTION

1. Field of the Invention

The present invention relates in general to a CMP process applied to the formation of a conductive wire by use of a damascene technique. In particular, the present invention relates to a method for avoiding the conductive wire from dishing and erosion effect produced during The CMP process.

2. Description of the Related Art

Chemical mechanical polishing (CMP) process is popularly applied to the planarization treatment of conductive wires in logic device processing and contact window processing. With respect to a damascene technique, after a contact window that passes through an insulating layer is filled with a conductive layer, the CMP process is utilized to remove the conductive layer outside the contact window, thus embedding the conductive layer into the insulating layer. However, during The CMP process, the stress transferred from a polishing pad to a chip is irregularly shared out when simultaneously polishing different materials or uneven portions. In general, when the insulating layer of a large area is employed as the polishing stop layer, a better polishing result is achieved. But, if an area ratio of the conductive wire to the insulating layer is over large, an over-polishing effect is produced.

The degree of the over-polishing effect depends on not only elasticity of the polishing pad and chemical characteristics of the polishing slurry, but also the pattern density and pattern size of the conductive wire. As shown in FIG. 1, when performing the CMP process on a conductive wire 2 of a high pattern density (more than 50%), the separated surface of an insulating layer 1 is very small and easily over-polished, and thus an appearance of erosion as shown by a dotted line 3 is produced in the insulating layer 1. Referring to FIG. 2, when performing the CMP process on a conductive wire 5 of a large pattern area, polishing rates of the conductive wire 5 and an insulating layer 4 are different from each other, as a result, the center area of the conductive wire 5 presents severe dishing effects as shown by a dotted line 6. Furthermore, it is noted that using a soft polishing pad of soft nature worsens the dishing.

SUMMARY OF THE INVENTION

An object of the present invention is to provide a method for avoiding erosion and dishing produced in the CMP process.

The method for avoiding defects produced in the CMP process of the present invention includes the steps of:

(a) providing a semiconductor substrate which has a plurality of predetermined contact window areas;

(b) sequentially depositing a first dielectric layer and a second dielectric layer on the semiconductor substrate, wherein the wet-etching rate of the first dielectric layer is greater than the wet-etching rate of the second dielectric layer;

(c) performing a dry etching process to form a plurality of first holes on the plurality of the predetermined contact window areas respectively, wherein each of the first holes passes through the second dielectric layer and the first dielectric layer to a predetermined depth;

(d) performing the wet etching process to etch the first dielectric layer in each of the first holes until a predetermined width, and thereby a plurality of second holes are formed on the plurality of the predetermined contact window areas respectively;

(e) forming a conductive layer to fill each of the second holes; and (f) performing the CMP process to level off the conductive layer and the second dielectric layer.

An advantage of the present invention is that the pattern density of the conductive layer disposed on the second dielectric layer is increased for resisting the transferred stress from the polishing pad and maintaining the shear stress of the conductive layer during the CMP process. Without changing the polishing pad, using different polishing slurries, tuning the polishing machine or improving the end-point detecting function, the present invention can effectively decrease erosion and dishing produced during the CMP process.

This and other objective of the present invention will no doubt become obvious to those of ordinary skill in the art after having read the following detailed description of the preferred embodiment which is illustrated in the various figures and drawings.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

[First Embodiment]

Figure 1:
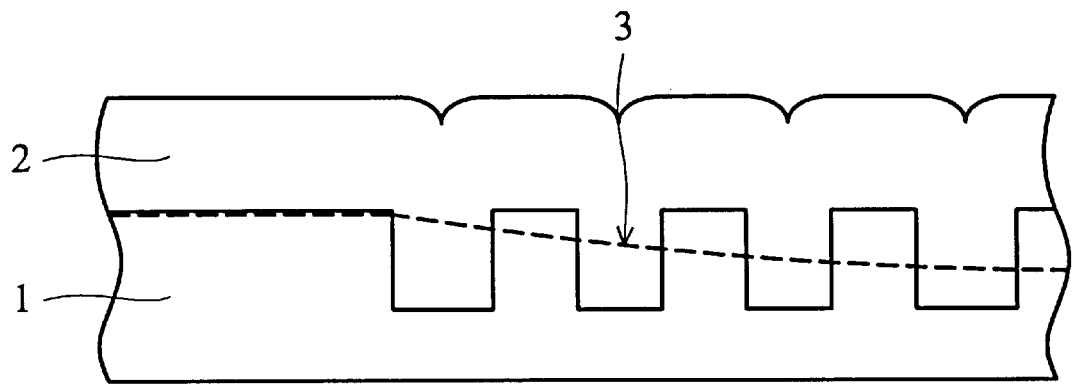
FIG. 1 shows erosion produced in the CMP process according to the prior art.
Figure 2:
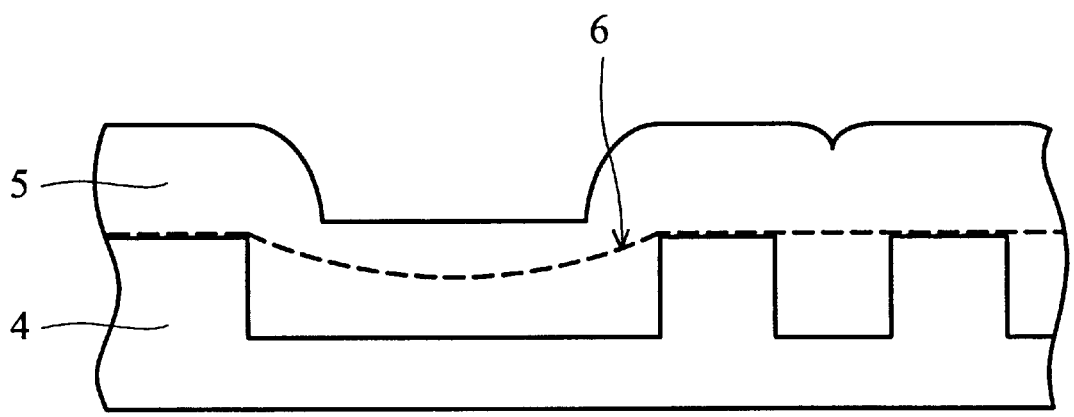
FIG. 2 shows dishing produced in the CMP process according to the prior art.
Figure 3A:
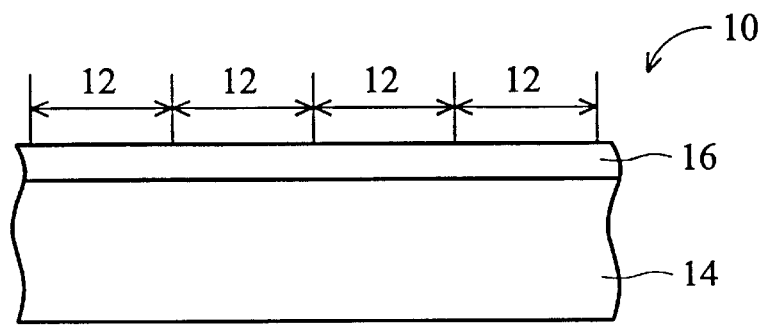
FIGS. 3A to 3E show a method of avoiding erosion produced in the CMP process according to the first embodiment of the present invention.

In the first embodiment of the present invention, a method of avoiding erosion produced in the CMP process is applied to a contact window process for forming a conductive wire of high pattern density. Please refer to FIGS. 3A to 3E, which show a method of avoiding erosion produced in the CMP process according to the first embodiment of the present invention. As shown in FIG. 3A, a plurality of contact window areas 12 are defined on a semiconductor substrate 10, wherein the pattern density of the contact window areas 12 is more than 50%. First, a first dielectric layer 14 and a second dielectric layer 16 are sequentially deposited on the semiconductor substrate 10. It is noted that the wet-etching rate of the first dielectric layer 14 should be larger that the wet-etching rate of the second dielectric layer 16. Preferably, the wet-etching rate of the first dielectric layer 14 to the second dielectric layer 16 is controlled at 3:1. Accordingly, the first dielectric layer 14 is made by borophosphosilicate glass (BPSG), while the second dielectric layer 16 is made by silane oxide. Alternatively, the first dielectric layer 14 is made by oxide, while the second dielectric layer 16 is made by nitride.

Figure 3B:
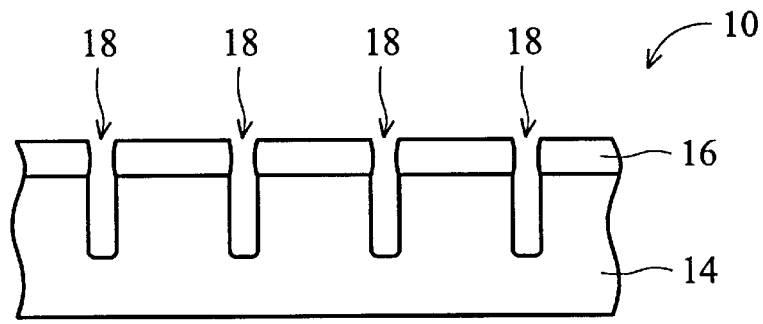
Figure 3C:
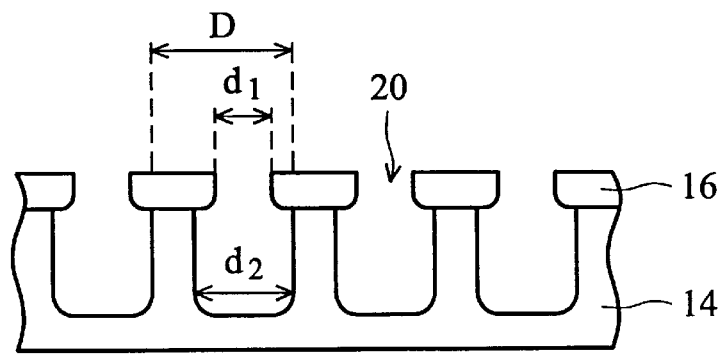

As shown in FIG. 3B, by using photolithography and dry etching process, a plurality of first holes 18 are formed on the contact window areas 12 respectively. Each of the first holes 18 passes through the second dielectric layer 16 and the first dielectric layer 14 until a predetermined depth without exposing the semiconductor substrate 10. Next, as shown in FIG. 3C, by using the wet etching process to transversely etch the first hole 18, the second dielectric layer 16 and the first dielectric layer 14 are etched to a predetermined width, and thereby the first holes 18 become a plurality of second holes 20. Since the wet-etching rate of the first dielectric layer 14 to the second dielectric layer 16 is about 3:1, the etched width of the first dielectric layer 14 triples the etched width of the second dielectric layer 16. As a result, with respect to the second hole 20, the opening diameter $d_1$ is smaller than the bottom diameter $d_2$ that is almost equal to the predetermined diameter D of the contact window area 12. Besides, the ratio of the opening diameter $d_1$ to the predetermined diameter D is preferably controlled at less than 55%.

Figure 3D:
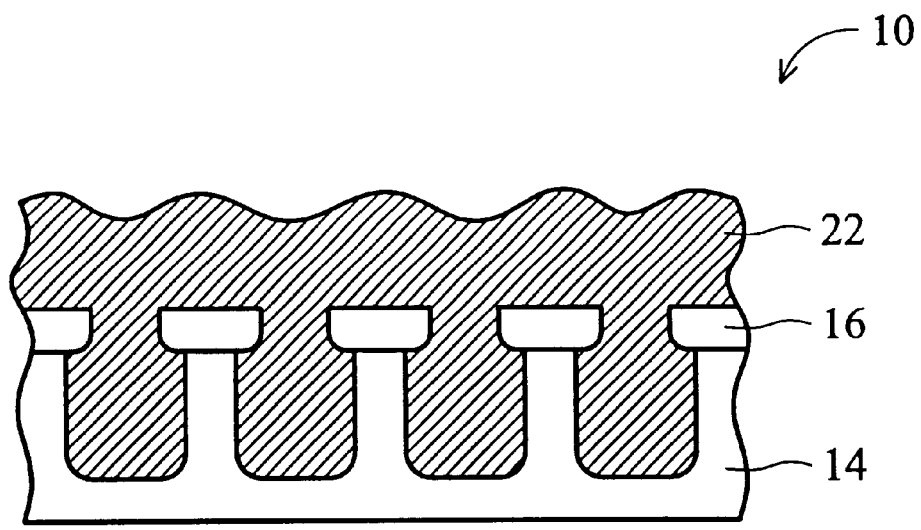
Figure 3E:
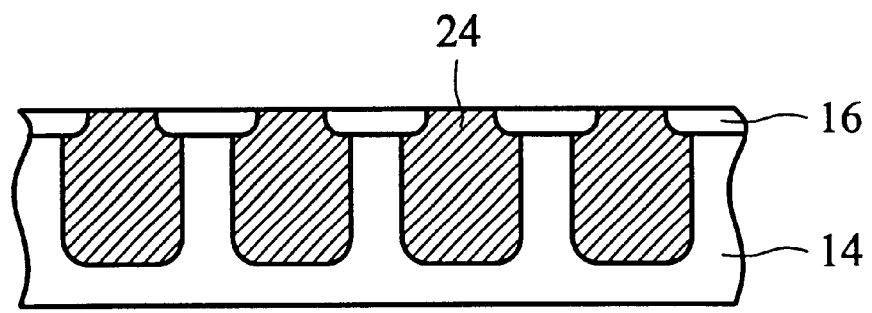

As shown in FIG. 3D, a conductive layer 22 is deposited on the semiconductor substrate 10 to fill each of the second holes 20. The conductive layer 22 is preferably made of a TiN/Ti laminator or a W/Cu laminator. Finally, as shown in FIG. 3E, using the second dielectric layer 16 as the stop layer, the cMP process is performed to remove part of the conductive layer 22 outside the second holes 20 until leveling off the conductive layer 22 and the second dielectric layer 16. Since the d/D ratio is less than 55%, the exposed conductive layer 22 is separated a longer distance by the second dielectric layer 16 and thus can prevent erosion effects from over-polishing the second dielectric layer 16 during the CMP process. In addition, wet etching can be further performed to completely remove the second dielectric layer 16 until exposing the first dielectric layer 14.

[Second Embodiment]

Figure 4A:
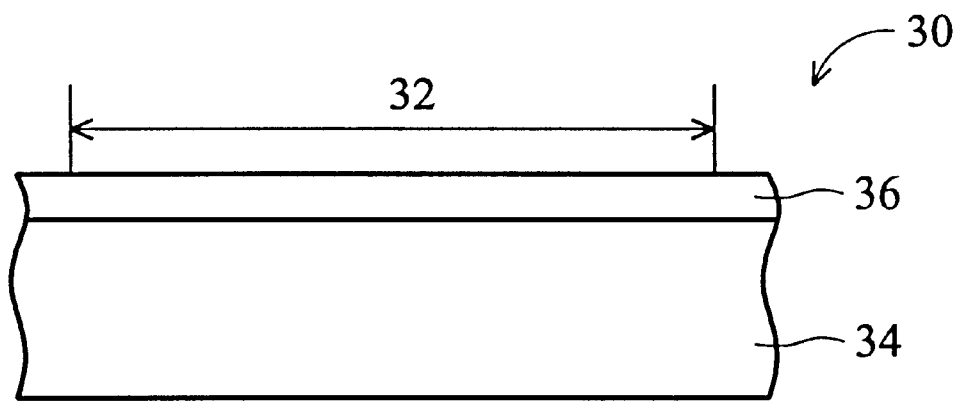
FIGS. 4A to 4E show a method of avoiding dishing produced in the CMP process according to the second embodiment of the present invention.

In the second embodiment of the present invention, a method of avoiding the dishing produced in the CMP process is applied to the formation of a conductive layer of a large area, such as a bond pad or a conductive wire. Please refer to FIGS. 4A to 4E, which show a method of avoiding dishing produced in The CMP process according to the second embodiment of the present invention. As shown in FIG. 4A, a predetermined conductive wire area 32 is defined on a semiconductor substrate 30. First, a first dielectric layer 34 and a second dielectric layer 36 are sequentially deposited on the semiconductor substrate 30. It is noted that the wet-etching rate of the first dielectric layer 34 should be larger that the wet-etching rate of the second dielectric layer 36. Preferably, the wet-etching rate of the first dielectric layer 34 to the second dielectric layer 36 is controlled at 3:1. Accordingly, the first dielectric layer 34 is made by borophosphosilicate glass (BPSG), while the second dielectric layer 36 is made by silane oxide. Alternatively, the first dielectric layer 34 is made by oxide, while the second dielectric layer 36 is made by nitride.

Figure 4B:
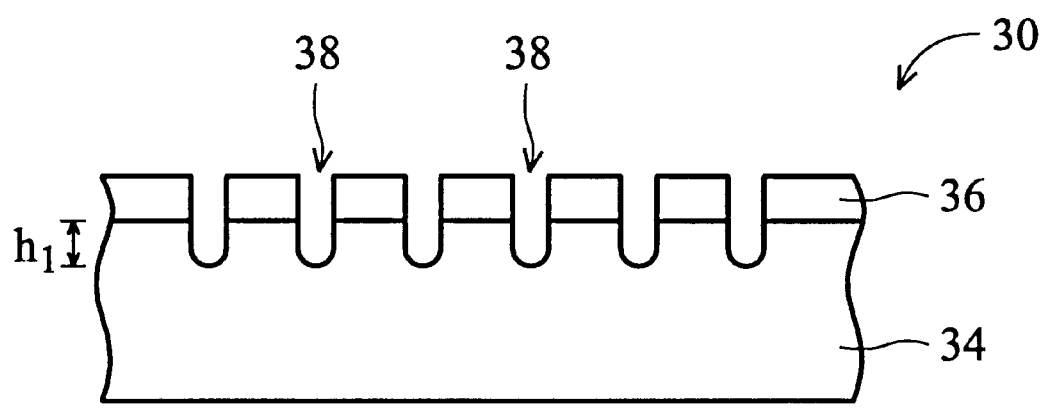
Figure 4C:
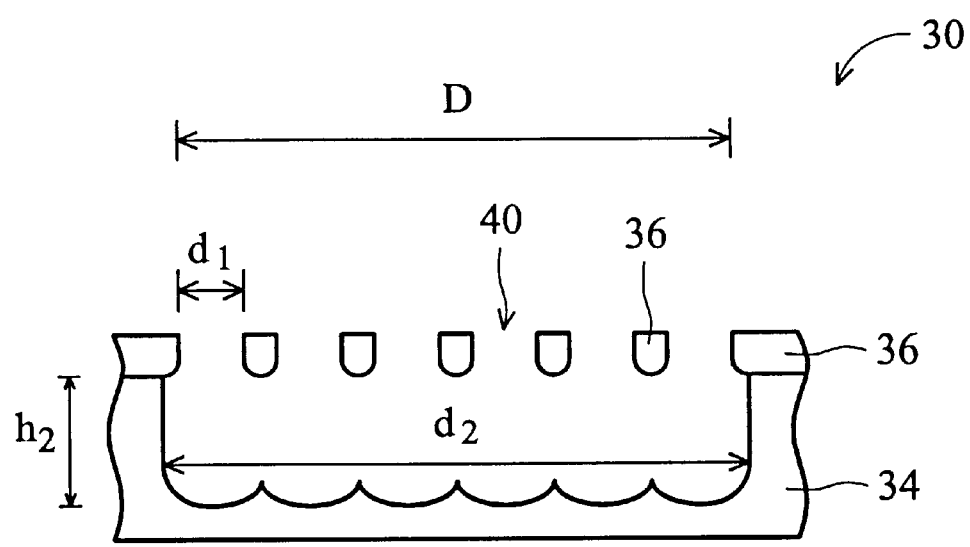
Figure 4C:
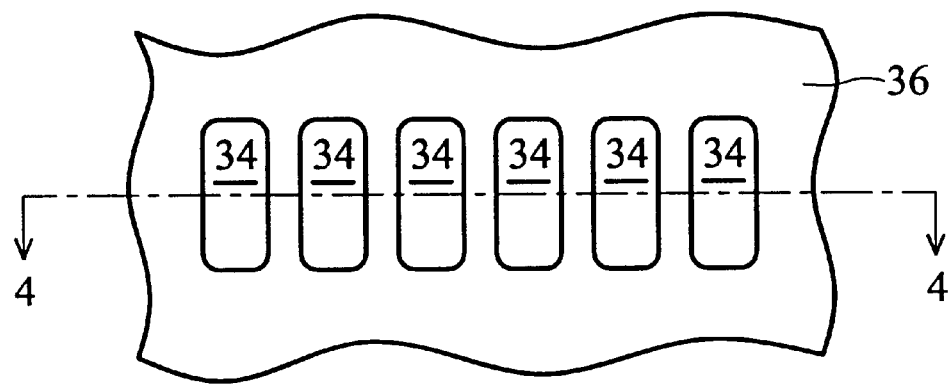

As shown in FIG. 4B, by using photolithography and dry etching, a plurality of first holes 38 are formed on the predetermined conductive wire area 32. Each of the first holes 18 passes through the second dielectric layer 36 and the first dielectric layer 34 to a first predetermined depth $h_1$ without connecting with each other nor exposing the semiconductor substrate 30. Compared with the first hole 18 in the first embodiment, the depth $h_1$ of the first hole 38 is smaller by shorten the dry-etching time. Next, as shown in FIGS. 4C and 4C' (FIG. 4C is a cross-sectional view along line 4—4 shown in FIG. 4C'), by using the wet etching process to etch the first holes 38, the second dielectric layer 36 and the first dielectric layer 34 are etched until a predetermined width and a second predetermined depth $h_2$.

Due to the wet-etching rate of the first dielectric layer 34 to the second dielectric layer 36 is about 3:1, the etched width of the first dielectric layer 34 triples the etched width of the second dielectric layer 36. Also, by appropriately increasing the wet-etching time to greatly etch the first dielectric layer 34, the first dielectric layer 34 disposed between adjacent first holes 38 is completely removed to make the first holes 38 pass through each other. As a result, a second hole 40 is formed on the predetermined conductive wire area 32, wherein the second dielectric layer 36 remaining on the semiconductor substrate 30 separates the opening of the second hole 40 into a plurality of small openings with opening diameter d1, and the bottom diameter d2 of the second hole 40 is almost equal to the predetermined diameter D of the predetermined conductive wire area 32.

Figure 4D:
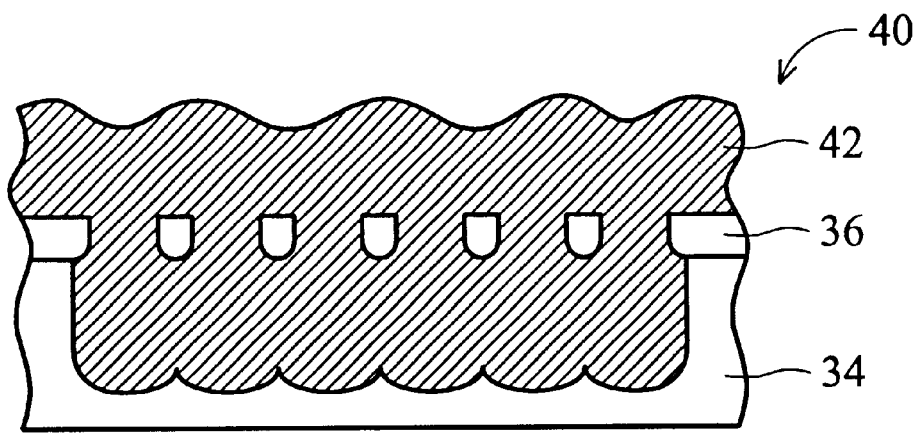
Figure 4E:
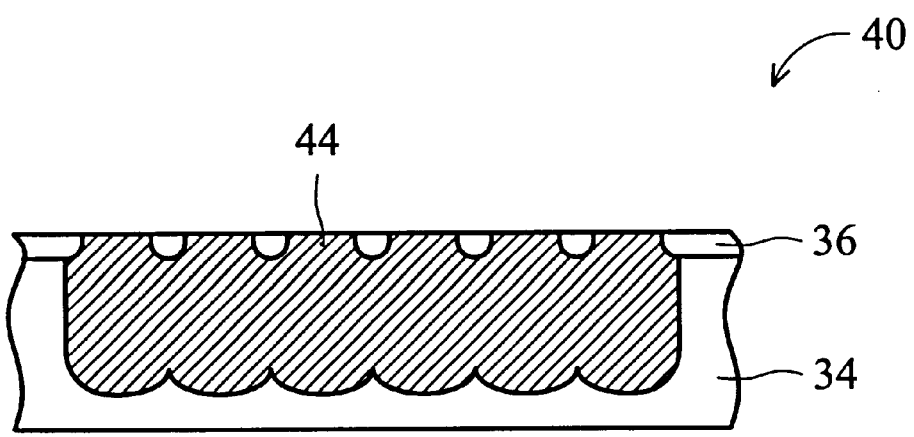

As shown in FIG. 4D, a conductive layer 42 is deposited on the semiconductor substrate 30 to fill the second hole 40. The conductive layer 42 is preferably made by a TiN/Ti laminator or a W/Cu laminator. Finally, as shown in FIG. 4E, using the second dielectric layer 36 as the stop layer, the CMP process is performed to remove part of the conductive layer 42 outside the second hole 40 until leveling off the conductive layer 42 and the second dielectric layer 36. Since the exposed conductive layer 42 is separated apart by the second dielectric layer 36, this can prevent dishing from over-polishing the conductive layer 42. In addition, wet etching process can be further performed to completely remove the second dielectric layer 36 until exposing the first dielectric layer 34.

Compared with the prior art which employs methods of changing the polishing pad, using different polishing slurries, tuning the polishing machine or improving the end-point detecting function, in the present invention, the pattern density of the conductive layer 22, 42 disposed on the second dielectric layer 16, 36 are increased for resisting the transferred stress from the polishing pad and maintaining the shear stress of the conductive layer 22, 42 during The CMP process. This can effectively minimize erosion and dishing produced during the CMP process.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method for avoiding defects produced in The CMP process, comprising the steps of:
    (a) providing a semiconductor substrate which has a predetermined conductive wire area;
    (b) sequentially depositing a first dielectric layer and a second dielectric layer on the semiconductor substrate, wherein the wet-etching rate of the first dielectric layer is greater than the wet-etching rate of the second dielectric layer;
    (c) performing dry etching process to form a plurality of first holes on the predetermined conductive wire area, wherein each of the first holes passes through the second dielectric layer and the first dielectric layer until a first predetermined depth;
    (d) performing wet etching process to etch the first dielectric layer in each of the first holes until a second predetermined depth, and thereby the first holes passing through each other become a second hole on the predetermined conductive wire area;
    (e) forming a conductive layer to fill the second hole; and
    (f) performing the CMP process to level off the conductive layer and the second dielectric layer.

2. The method as claimed in claim 1, wherein the wet-etching rate of the first dielectric layer to the second dielectric layer is not smaller than 3.

3. The method as claimed in claim 1, wherein the first dielectric layer is made by borophosphosilicate glass (BPSG) and the second dielectric layer is made by silane oxide.

4. The method as claimed in claim 1, wherein the first dielectric layer is made by oxide and the second dielectric layer is made by nitride.

5. The method as claimed in claim 1, wherein the bottom diameter of the second hole is equal to the diameter of the predetermined conductive wire.

6. The method as claimed in claim 1, further comprising the step of:

(g) performing wet etching process to remove the exposed second dielectric layer.

* * * * *